(12) United States Patent
Terao

(10) Patent No.: US 10,206,305 B2
(45) Date of Patent: Feb. 12, 2019

(54) SUPPORT DEVICE AND SUPPORT METHOD

(71) Applicant: NEC Platforms, Ltd., Kawasaki-shi, Kanagawa (JP)

(72) Inventor: Chiaki Terao, Kanagawa (JP)

(73) Assignee: NEC Platforms, Ltd., Kawasaki-shi (JP)

( * ) Notice: Subject to any disclaimer, the term of this patent is extended or adjusted under 35 U.S.C. 154(b) by 0 days.

(21) Appl. No.: 15/519,261

(22) PCT Filed: Nov. 9, 2016

(86) PCT No.: PCT/JP2016/004849
§ 371 (c)(1),
(2) Date: Apr. 14, 2017

(87) PCT Pub. No.: WO2017/145206
PCT Pub. Date: Aug. 31, 2017

(65) Prior Publication Data
US 2018/0092239 A1 Mar. 29, 2018

(30) Foreign Application Priority Data
Feb. 23, 2016 (JP) ................................. 2016-032038

(51) Int. Cl.
*E04G 3/00* (2006.01)
*H05K 7/16* (2006.01)
(Continued)

(52) U.S. Cl.
CPC ............ *H05K 7/16* (2013.01); *F16M 11/048* (2013.01); *F16M 11/08* (2013.01); *F16M 13/02* (2013.01);
(Continued)

(58) Field of Classification Search
CPC ...... F16M 11/08; F16M 13/02; F16M 11/048; H05K 7/16; H05K 7/1461
(Continued)

(56) References Cited

U.S. PATENT DOCUMENTS 4,923,259 A * 5/1990 Bartok ............... A47B 21/0314
108/143
5,294,087 A * 3/1994 Drabczyk ............ A47B 21/007
108/138
(Continued)

FOREIGN PATENT DOCUMENTS

CN 203914936 U 11/2014
CN 105144857 A 12/2015
(Continued)

OTHER PUBLICATIONS

Communication dated Feb. 2, 2018, from the European Patent Office in counterpart European Application No. 16849930.9.
(Continued)

*Primary Examiner* — Gwendolyn W Baxter
(74) *Attorney, Agent, or Firm* — Sughrue Mion, PLLC

(57) ABSTRACT

Provided is a support device configured to achieve space saving of an occupied area of a wall surface required for carrying out maintenance work. The support device includes a pair of support legs to be mounted to a housing of an electronic device to support the housing; a pair of fixing legs to be mounted to a mounting surface, at which the electronic device is to be installed, to fix the electronic device at a position at which the electronic device is to be installed; and a pair of slide hinge mechanisms configured to couple end portions of the pair of support legs to end portions of the pair of fixing legs in a manner in which the pair of support legs is pivotable with respect to the pair of fixing legs in an upright direction, and in a manner in which the pair of (Continued)

support legs is horizontally slidable with respect to the pair of fixing legs.

11 Claims, 10 Drawing Sheets

(51) Int. Cl.
*F16M 11/04* (2006.01)
*F16M 11/08* (2006.01)
*F16M 13/02* (2006.01)
*H05K 7/14* (2006.01)
*H05K 5/02* (2006.01)

(52) U.S. Cl.
CPC ......... *H05K 5/0204* (2013.01); *H05K 7/1461* (2013.01)

(58) Field of Classification Search
USPC .................................. 248/285.1, 675, 286.1
See application file for complete search history.

(56) References Cited

U.S. PATENT DOCUMENTS

| | | | | |
|---|---|---|---|---|
| 5,405,204 A | * | 4/1995 | Ambrose | A47B 21/0314 400/472 |
| 5,662,591 A | * | 9/1997 | Peindl | A61B 5/224 5/648 |
| 6,082,692 A | * | 7/2000 | Price | A47B 21/0314 248/278.1 |
| 6,273,382 B1 | * | 8/2001 | Pemberton | A47B 21/0314 248/118.1 |
| 6,536,728 B1 | * | 3/2003 | Hagglund | A47B 21/0314 108/138 |
| 6,938,866 B2 | * | 9/2005 | Kirchhoff | A47B 21/0314 248/274.1 |
| 2002/0084729 A1 | | 7/2002 | Nunokawa et al. | |
| 2013/0182396 A1 | | 7/2013 | Hu | |
| 2016/0037662 A1 | | 2/2016 | Terao | |
| 2016/0044804 A1 | | 2/2016 | Nakamura | |

FOREIGN PATENT DOCUMENTS

| | | |
|---|---|---|
| JP | 64-006064 U | 1/1989 |
| JP | 01-112094 U | 7/1989 |
| JP | 02-131392 U | 10/1990 |
| JP | 05-085186 U | 11/1993 |
| JP | 2001-339172 A | 12/2001 |
| JP | 2002-237710 A | 8/2002 |
| JP | 2010-171177 A | 8/2010 |
| JP | 5721192 B2 | 5/2015 |

OTHER PUBLICATIONS

International Search Report for PCT/JP2016/004849 dated Jan. 24, 2017.
Written Opinion of PCT/JP2016/004849 dated Jan. 24, 2017.
Communication dated Mar. 5, 2018, from the State Intellectual Property Office of People's Republic of China in counterpart Application No. 201680003268.8.

\* cited by examiner

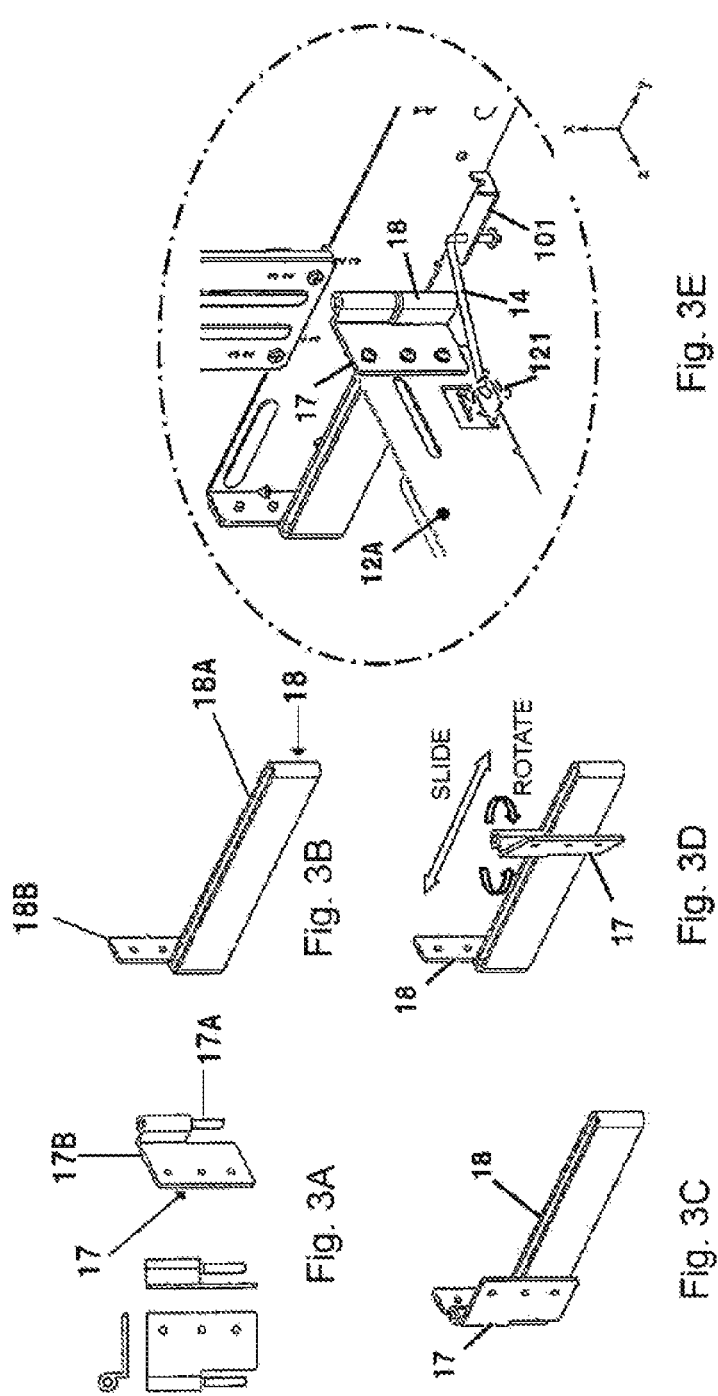

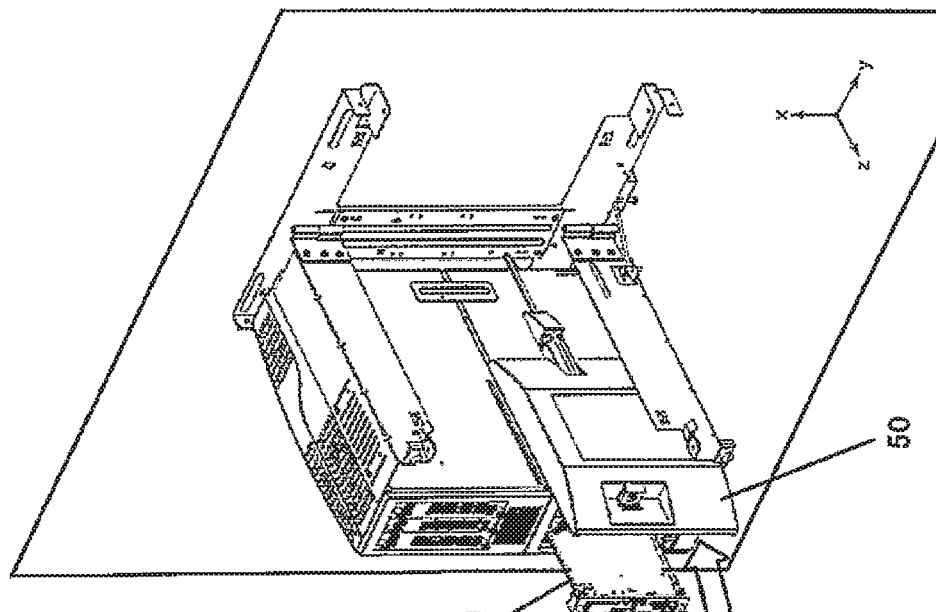
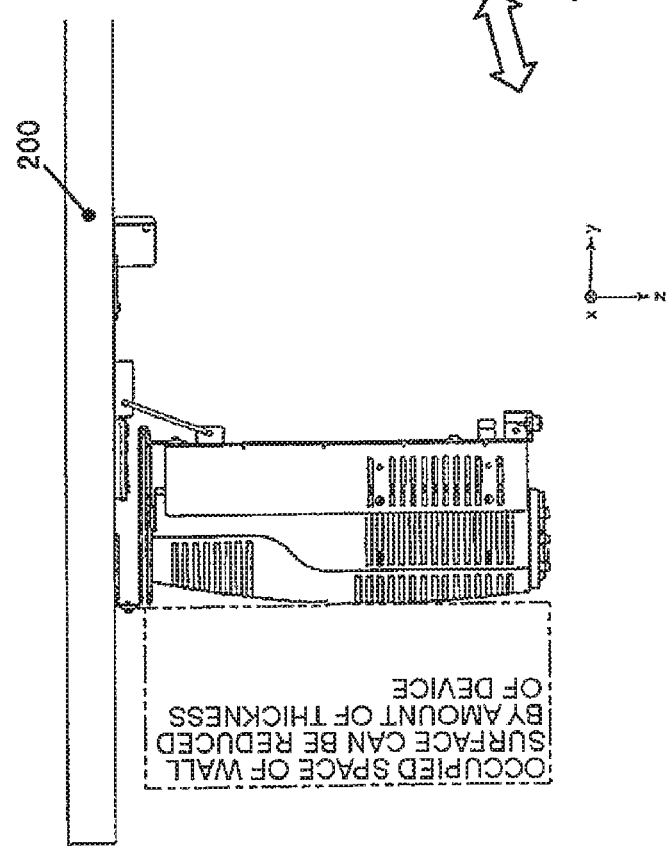
Fig. 4A
Fig. 4B

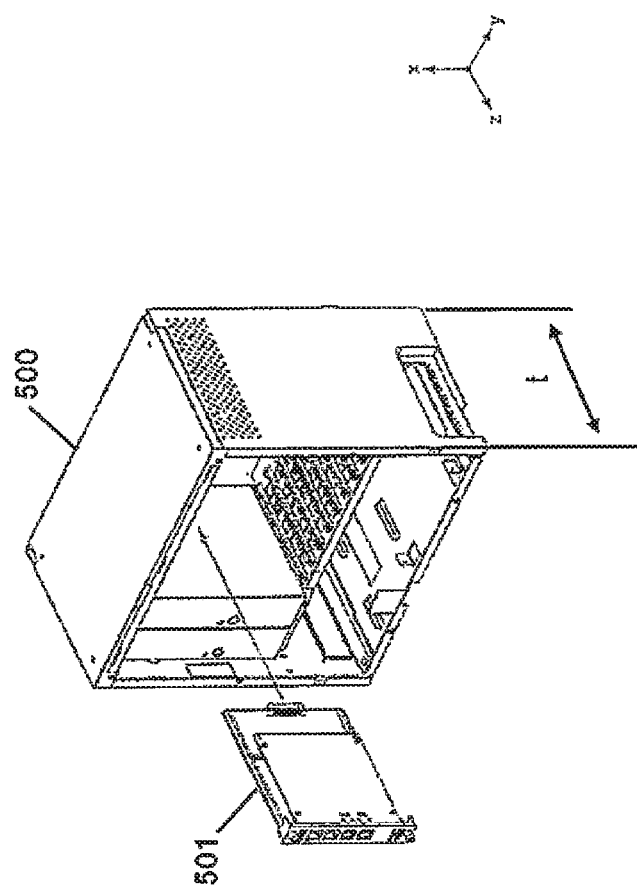

though the electronic device and other devices are pivotable in the upright direction, the operation of maintaining such state is difficult, which causes a problem in that work efficiency is deteriorated.

SUPPORT DEVICE AND SUPPORT METHOD

CROSS REFERENCE TO RELATED APPLICATIONS

This application is a National Stage of International Application No. PCT/JP2016/004849 filed Nov. 9, 2016, claiming priority based on Japanese Patent Application No. 2016-032038 filed Feb. 23, 2016, the contents of all of which are incorporated herein by reference in their entirety.

TECHNICAL FIELD

This invention relates to a support device for wall-mounting electronic devices, such as communication control devices, and to a support method therefor.

BACKGROUND ART

In order to save a space, support devices for wall-mounting electronic device housings have been developed. For example, there is a support device that is compatible with both an installation method for placing the housing on a table or on a floor, and an installation method for wall-mounting the housing to a wall surface.

As such a support device, in JP-A-2010-171177, there is disclosed a support device including a pair of support legs, which has a plate shape and has a first plate surface having a leg convex portion or a leg concave portion formed correspondingly to a housing concave portion or a housing convex portion, and an intermediate member. In JP-A-2010-171177, when wall-mounting the housing, the housing is hooked and supported in front of the first plate surface by joining the pair of support legs to each other through the intermediate member and mounting the pair of support legs so that a second plate surface thereof contacts the wall surface, and by engaging the housing concave portion or the housing convex portion formed on the back surface of the housing with the leg convex portion or the leg concave portion.

In JP-A-2001-339172, there is disclosed a wall-mounting device configured to install a plurality of electronic device housings of a telephone exchange and the like on a wall of a building and the like. The wall-mounting device includes a device-mounting bracket to be mounted to the wall, the device-mounting bracket including a receiving shelf on which a lower surface of one electronic device housing among the plurality of electronic device housings is to be placed, a mounting base plate from which the receiving shelf projects, and a mounting portion configured to mount the one electronic device housing to the mounting base plate. The device mounting bracket further includes mounting means for mounting a device extension bracket configured to allow another electronic device housing to be arranged in an overlapping manner in front of the wall of the one electronic device housing. Further, in JP-U-H05-85186, the following device is disclosed. An extension housing is rotatably arranged by a spindle in a base housing including a basic circuit board and a power supply unit, an extension circuit board is removably arranged in the extension housing, and one side of the extension housing is fixed to a wall surface by a mounting member.

Further, in JP-B2-5721192, there is disclosed a support device, which solves some of the problems of JP-A-2010-171177, JP-A-2001-339172, and JP-U-H05-85186. The support device disclosed in JP-B2-5721192 includes a pair of support legs configured to support a housing, a pair of fixing legs to be mounted to a mounting surface, and a movable mechanism configured to pivotally couple the pair of support legs and the pair of fixing legs.

JP-A-2010-171177 and JP-A-2001-339172 describe the structure suitable for a case where the electronic device is fixedly mounted to the wall surface. Thus, it is necessary to remove the electronic device from the wall-mounting device each time when a maintenance work is carried out. In JP-U-H05-85186, the housing of the electronic device needs to be mounted as a set, and hence it is difficult to achieve space saving. Further, because the housing cannot be integrally moved with the support device, there is a problem in that efficient maintenance work cannot be performed.

Meanwhile, the support device, which is disclosed in JP-B2-5721192 and includes the movable mechanism, can achieve the space saving of an occupied area of a wall surface and can facilitate the maintenance work in contrast to JP-A-2010-171177, JP-A-2001-339172, and JP-U-H05-85186. Not only a mounting space for the electronic device but also a maintenance space, which is required each time when the electronic device and other devices are maintained, needs to be considered.

For example, FIGS. 9A and 9B show illustrations of an associated support device for supporting a housing 400 of an electronic device or other devices. As illustrated in FIG. 9A and FIG. 9B, mounting directions of an option card 401 and a battery 402 to the electronic device mounted to the support device extend from side surfaces of the electronic device. As a result, when the electronic device is wall-mounted, it is necessary to secure a large work space in the horizontal direction for the maintenance work of the option card 401 or the battery 402. Further, when it is difficult to secure the work space, the electronic device needs to be dismounted from the wall surface each time when the maintenance work is carried out. In addition, during the maintenance work, because the mounting direction of each ancillary device is different, the work cannot be performed from the same direction, which makes maintenance work more complex.

FIG. 10 is an illustration of an associated support device 500 for installing the electronic device at a predetermined position. With the support device 500 such as that illustrated in FIG. 10, although an option card 501 can be inserted and removed from the front surface, the profile of the overall device increases, and hence under an installed state the device protrudes further from the wall surface.

DISCLOSURE OF THE INVENTION

Problem to be Solved by the Invention

Maintenance works, such as repair work and extension work, may be carried out after the housing of the electronic device or other devices has been mounted to the support device and installed by mounting to the wall. In the case of a support device such as that illustrated in FIG. 9, the maintenance work or the like is required to be carried out from the side surface of the housing, which makes maintenance work more difficult and causes work efficiency to be deteriorated. Further, in the case of the example of the support device illustrated in FIG. 10, although the maintenance work can be carried out from the front surface of the housing, the profile of the overall device increases, and hence the space saving cannot be achieved.

In contrast to the above-mentioned cases, the support device disclosed in Patent Document 4 includes the movable mechanism and is constructed such that the electronic device and other devices are pivotable in an upright direction. With this structure, the space saving can be achieved and workability can greatly be improved.

The inventor intends to achieve further space saving as compared to the support device disclosed in Patent Document 4.

When the electronic device and other devices are pivoted from the wall surface in the upright direction using the movable mechanism of the support device disclosed in Patent Document 4, an occupied space of a wall surface having a thickness of the electronic device and other devices is required on a wall surface side. Therefore, an occupied space of a wall surface is increased. This regard is at least improved.

This invention is devised under the above-mentioned background, and provides a support device and a support method, which can achieve space saving of the occupied area of a wall surface and have a good workability when an electronic device and the other devices are installed on a wall surface.

Means to Solve the Problem

A support device according to one aspect of this invention comprises a pair of support legs to be mounted to a housing of an electronic device to support the housing; a pair of fixing legs to be mounted to a mounting surface, at which the electronic device is to be installed, to fix the electronic device at a position at which the electronic device is to be installed; and a pair of slide hinge mechanisms configured to couple end portions of the pair of support legs to end portions of the pair of fixing legs in a manner in which the pair of support legs is pivotable with respect to the pair of fixing legs in an upright direction, and in a manner in which the pair of support legs is horizontally slidable with respect to the pair of fixing legs.

A support method using a support device of an electronic device according to another aspect of this invention comprises coupling end portions of a pair of support legs, which is to be mounted to a housing of the electronic device to support the housing, and end portions of a pair of fixing legs, which is to be mounted to a mounting surface at which the electronic device is to be installed to fix the electronic device at a position at which the electronic device is to be installed, through intermediation of a pair of slide hinge mechanisms, which is configured to couple the end portions of the pair of support legs to the end portions of the pair of fixing legs in a manner in which the pair of support legs is pivotable with respect to the pair of fixing legs in an upright direction, and in a manner in which the pair of support legs is horizontally slidable with respect to the pair of fixing legs; and horizontally sliding the electronic device with respect to the pair of fixing legs and pivoting the electronic device with respect to the pair of fixing legs in the upright direction when the electronic device is shifted from a received state to a pivoted state.

Effect of the Invention

According to this invention, it is possible to provide the support device and the support method, which can achieve the space saving of the occupied area of a wall surface and have the good workability when the electronic device and the other devices are installed on the wall surface.

BRIEF DESCRIPTION OF THE DRAWING

FIGS. 3A, 3B, 3C, 3D and 3E include explanatory views for illustrating a member of a slide hinge mechanism 13 in the support device 1 according to the first embodiment.

FIGS. 4A and 4B include explanatory views for illustrating space saving of the support device 1 according to the first embodiment.

FIG. 10 is an explanatory view for illustrating an electronic device, which is supported by another associated support device configured to support the electronic device.

MODE(S) FOR EMBODYING THE INVENTION

With reference to the drawings, embodiments of this invention are described.

First Embodiment

Figure 1C:
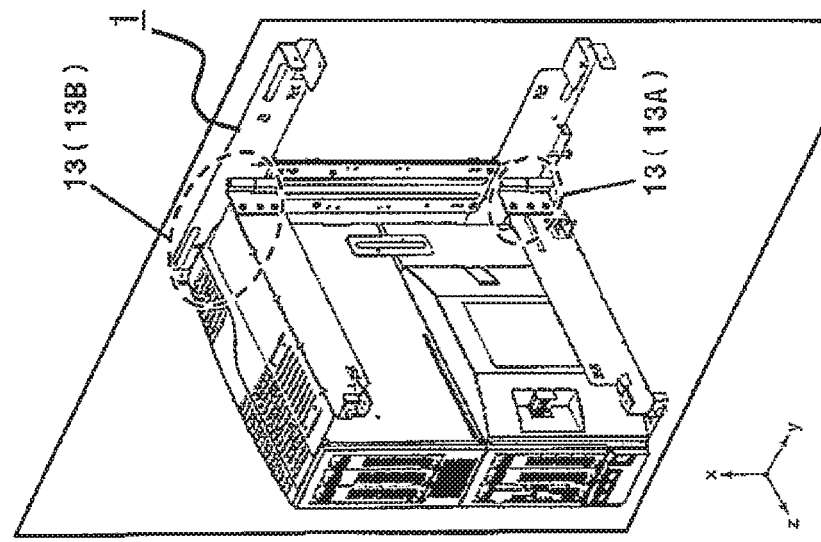
FIGS. 1A, 1B and 1C include schematic configuration views for illustrating a configuration of a support device 1 according to a first embodiment of this invention.
Figure 1B:
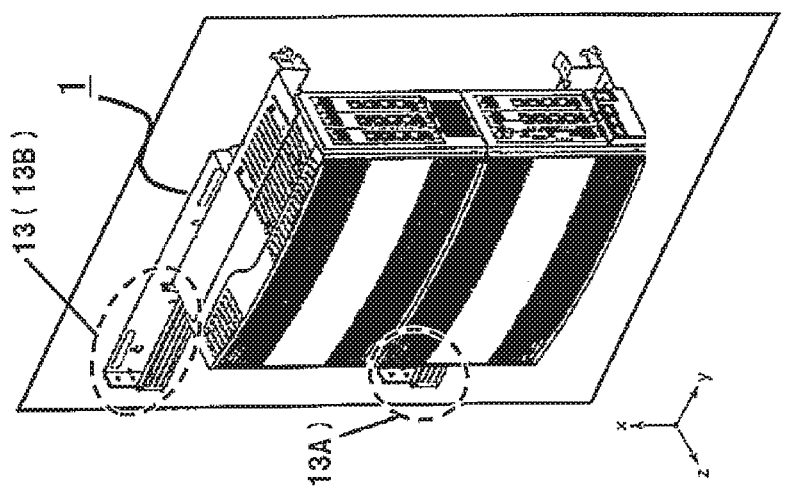
Figure 1A:
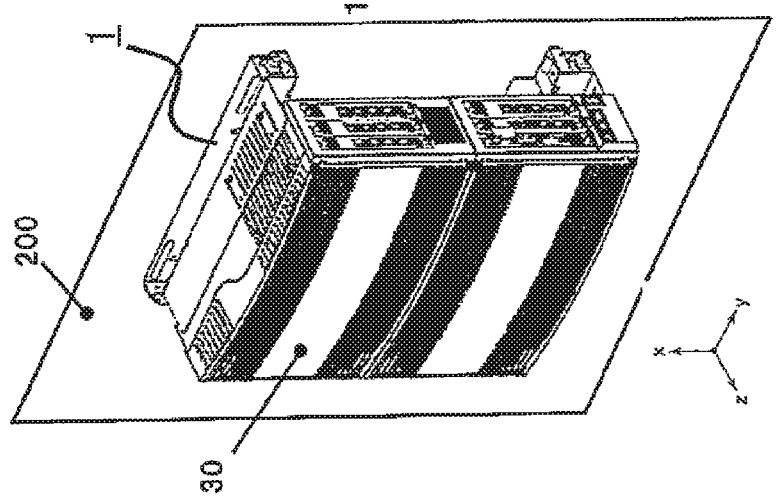

First, a first embodiment of this invention is described. FIGS. 1A, 1B and 1C show schematic configuration views for each illustrating a configuration of a support device 1 according to this embodiment. In FIGS. 1A, 1B and 1C, the support device 1 is utilized for wall-mounting and installing a housing 30 of an electronic device, such as a communication control device, for example, a key telephone main device or an IP telephone control device, to a mounting surface 200. During maintenance work, a worker slides and pivots (rotates) support legs 12A and 12B of the support device 1, to which the housing 30 is mounted, about slide hinge mechanisms 13 (13A and 13B). With this, a work space can be secured without removing the housing 30 from the support device 1, that is, from the mounting surface 200.

As illustrated in the figures, a Cartesian coordinate system (X, Y, Z) is employed. In the states illustrated in all of the figures except FIG. 10, the X-axis direction in the Cartesian coordinate system (X, Y, Z) is the vertical direction (height direction) extending parallel to the mounting surface 200 on which the support device 1 is to be installed, the Y-axis direction is the horizontal direction (width direction) extending parallel to the mounting surface 200 and orthogonal to the X-axis direction, and the Z-axis direction is the front-back direction (depth direction) orthogonal to the mounting surface 200.

FIGS. 1A, 1B and 1C show views for each illustrating the support device 1 according to this embodiment to which the housing 30 of the electronic device is mounted. The support device 1 illustrated in FIG. 1A is in a state in which the support device 1 is folded. The support device 1 illustrated in FIG. 1B is in a state in which the support device 1 illustrated in FIG. 1A is slid for allowing operations such as the maintenance work and mounting/dismounting of an ancillary device. The support device 1 illustrated in FIG. 1C is in a state of being pivoted from the state illustrated in FIG. 1B.

As illustrated in FIG. 1A, FIG. 1B, and FIG. 1C, under a state in which the support device 1 is finally pivoted by 90°, the ancillary devices such as an option card 40 and a battery 50, which are described later, can be mounted and dismounted, and setting and the maintenance work on the electronic device can be carried out. Normally, as illustrated in FIG. 1A, the support device 1 is folded and fixed to the mounting surface 200 such as a wall, and the housing 30 of the electronic device, the support device 1, and a work space can be compact.

Figure 2A:
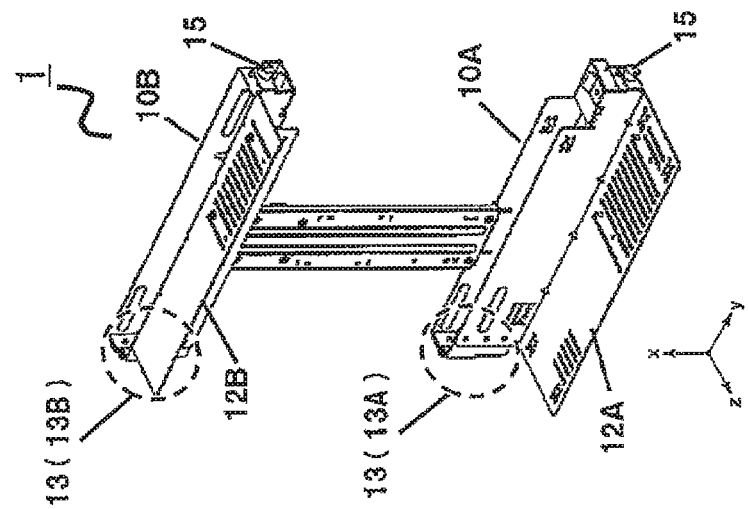
FIGS. 2A, 2B and 2C include explanatory views for illustrating a schematic configuration of the support device 1 illustrated in FIGS. 1A, 1B and 1C.
Figure 2B:
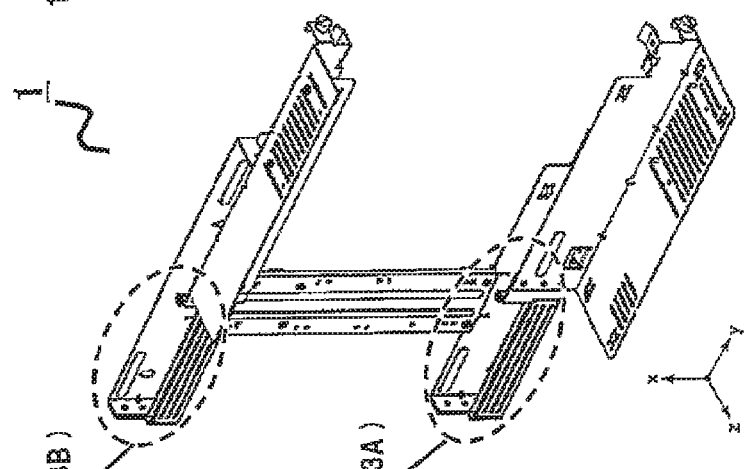
Figure 2C:
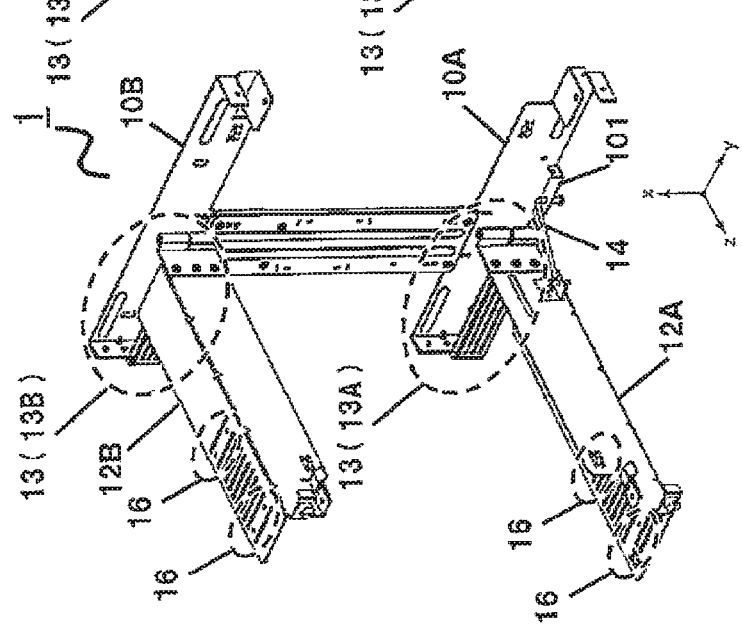

FIGS. 2A, 2B, and 2C show explanatory views for each illustrating a schematic configuration of the support device 1 according to the first embodiment. In FIG. 2A, the support legs 12A and 12B of the support device 1 are slid in the Y-axis direction and pivoted by 90° in the Z-axis direction from the Y-axis direction. In FIG. 2B, the support legs 12A and 12B are pivoted in the Y-axis direction from the state illustrated in FIG. 2A. In FIG. 2C, the support legs 12A and 12B are positioned in the Y-axis direction, and the support device 1 is folded by fixing the support legs 12A and 12B and fixing legs 10A and 10B with male screws 15. Although the male screw 15 (knurled screw) is illustrated in FIG. 2C, a locking mechanism of other types may be employed.

As illustrated in FIGS. 2A, 2B and 2c, the support device 1 includes the fixing legs 10A and 10B to be mounted to the mounting surface 200 such as a wall to fix the electronic device at a position to be installed, and the support legs 12A and 12B configured to support the housing 30. The support device 1 further includes a pair of slide hinge mechanisms 13A and 13B, which is configured to slide the support legs 12A and 12B in a horizontal direction and to pivotally couple end portions of the support legs 12A and 12B to end portions of the fixing legs 10A and 10B, respectively. A distance between the fixing leg 10A and the fixing leg 10B, and a distance between the support leg 12A and the support leg 12B are maintained in accordance with a width of the electronic device held by a height-adjustment member 11. The support device 1 further includes an angle-adjustment shaft 14 configured to adjust a position or an angle by coupling the fixing legs 10A and 10B and the support legs 12A and 12B.

The fixing legs 10A and 10B are a pair of brackets having a rectangular shape, which may be, for example, formed of plate-shaped brackets. The fixing legs 10A and 10B are fixed to the mounting surface 200 using screws or the like. Further, the fixing leg 10A includes a shaft mounting portion 101 for mounting the angle-adjustment shaft 14.

The height-adjustment member 11 is a plate-shaped bracket having a rectangular shape, for example. The fixing legs 10A and 10B, which are arranged in parallel, are indirectly connected to each other through the height-adjustment member 11. In this embodiment, as illustrated in FIGS. 1A, 1B and 1C, the height-adjustment member 11 is perpendicularly connected at a position roughly midway in the longitudinal direction of each of the fixing legs 10A and 10B arranged in parallel.

The support legs 12A and 12B are L-shaped members, which are formed of, for example, plate-shaped brackets. The support leg 12A extends in an L-shape in the −Y-axis direction of the Y-Z plane and the X-axis direction of the X-Z plane. The support leg 12B extends in an L-shape in the −Y-axis direction of the Y-Z plane and the −X-axis direction of the X-Z plane.

Housing mounting holes 16 for supporting the housing 30 are formed in portions of the Y-Z plane of each of the support legs 12A and 12B. The housing 30 is supported by, for example, fixing screw, projections, or the like to the housing mounting holes 16. Further, a shaft fixing hole 121, which is described later, is formed in the support leg 12A.

As illustrated in FIGS. 2A, 2B and 2C, as members for coupling the fixing leg 10A and the support leg 12A, and the fixing leg 10B and the support leg 12B, the slide hinge mechanisms 13A and 13B are connected to end portions of the members (depth side in the drawing sheet). As illustrated in FIGS. 2A, 2B and 2C, the slide hinge mechanism 13 is configured to couple the end portions of the support legs 12A and 12B to the end portions of the fixing legs 10A and 10B on a side opposite to a working surface of the electronic device, respectively. Further, the slide hinge mechanism 13 has a pivotable angle ranging from 0° to 90°.

FIGS. 3A, 3B, 3C, 3D and 3E show explanatory views for each illustrating members of the slide hinge mechanism 13. The slide hinge mechanisms 13A and 13B according to this embodiment each include a hinge piece 17 (see FIG. 3A) and a rail member 18 (see FIG. 3B) as components. The hinge piece 17 is formed of a pivot-sliding shaft 17A and a plate portion 17B. Further, the rail member 18 is formed of a slide rail 18A and a plate portion 18B. Further, as illustrated in FIG. 3C and FIG. 3D, in the slide hinge mechanism 13, the pivot-sliding shaft of the hinge piece 17 is slidable in the rail of the rail member 18 and has the pivotable angle ranging from 0° to at least 90°.

FIG. 3E is an enlarged view of a connecting portion (lower side in FIG. 3E) of the support device 1 according to this embodiment. The support device 1 illustrated in FIG. 3E is in a state in which the support legs 12A and 12B are pivoted by 90° about the slide hinge mechanisms 13 from the Y-axis direction to the Z-axis direction. In this embodiment, the support leg 12A has the shaft fixing hole 121 for fixing at 90°. In FIG. 3E, the angle-adjustment shaft 14 mounted to the shaft mounting portion 101 of the fixing leg 10A is inserted into the shaft fixing hole 121 for fixing at 90°, to thereby fix the angle. A fixing groove may be adopted instead of the shaft fixing hole. In this embodiment, although the shaft fixing hole 121 for fixing at 90° is exemplified, this invention is not limited thereto. For example, a shaft fixing hole or groove for fixing at 50° or 150° may be formed as appropriate.

Based on this configuration, the slide hinge mechanism 13 acts as the movable mechanism enabling the support legs 12A and 12B and the housing 30 supported by the support legs 12A and 12B to be slid in the X-Y plane and to be pivoted by 90° from the X-Y plane to the X-Z plane. Further, as illustrated in FIG. 1, this configuration also enables the housing 30 supported by the support legs 12A and 12B to be arranged on the mounting surface 200. In addition, the height in the X-axis direction between the fixing legs 10A and 10B and the height in the X-axis direction between the support legs 12A and 12B become the same. This height is determined by the height-adjustment member 11. In this embodiment, the height is equivalent to two electronic devices. However, this invention is not limited to this configuration.

According to this embodiment, as illustrated in FIG. 1A, when the support device 1, to which the housing 30 is mounted, is in a folded state, the space saving can be achieved because a thickness t from the mounting surface 200 such as a wall can be suppressed. Meanwhile, during maintenance or cabling work, the support device 1 can be brought into a pivoted state illustrated in FIG. 1C via the state of FIG. 1B. Thus, the work space can be secured, with the result that the maintenance work can easily be carried out. Further, at this time, as illustrated in FIG. 4A, a mode in which the housing 30 is slid by a thickness of the housing 30 and shifted to the pivoted state can be adopted. With this mode, a space required on a left side of the device of FIG. 4A is not required as a space for shifting the device. Thus, when the housing 30 is installed on the wall surface, the space saving of an occupied area of a wall surface can be achieved. Further, as illustrated in FIG. 4B, the mounting/dismounting of the ancillary device such as the option card 40 and the battery 50, and access to a connector can be carried out in the same direction from a front surface of the housing 30.

Next, a method of supporting the housing 30 of the electronic device to be mounted to the support device 1 according to this embodiment is described.

During maintenance work on the housing 30 mounted to the support device 1, first, the male screws 15 fixing each of the support legs 12A and 12B and each of the fixing legs 10A and 10B are removed. Then, the pair of support legs 12A and 12B is slid together with the mounted electronic device (housing 30) in the horizontal direction of +Y direction, and is pivoted in the Z-axis direction from the Y-axis direction. Next, as necessary, the support legs 12A and 12B are fixed at a desired angle using the angle-adjustment shaft 14. In this embodiment, the support legs 12A and 12B and the mounted housing 30 can be fixed at an angle of 90° by inserting the angle-adjustment shaft 14 in the notch-shaped shaft fixing hole 121 formed in the support leg 12A. Because a work space can be easily secured in an opened state, maintenance work is performed in this state. After maintenance work has been completed, the support device 1 is folded by pivoting the support legs 12A and 12B and the mounted electronic device (housing 30) in the Y-axis direction from the Z-axis direction, and sliding those members in the −Y-axis direction. Finally, each of the support legs 12A and 12B and each of the fixing legs 10A and 10B are fixed with the locking mechanisms (male screws 15).

According to the embodiment of this invention, when installing the housing 30 of the electronic device such as a control device on the mounting surface 200 such as a wall surface, the space saving of the occupied area of a wall surface can be achieved.

Second Embodiment

Next, a second embodiment according to this invention is described. The second embodiment and subsequent embodiments described below are modification examples of the first embodiment. In each embodiment, each structure can be combined as appropriate. Now, in each embodiment, parts having the same function as the parts already described in the first embodiment are denoted by the same reference symbols, and a description thereof is omitted.

Now, with reference to the drawings, detailed description is made of the support device 1 of this embodiment.

The second embodiment is different from the first embodiment in members and structure of the slide hinge mechanism. With the slide hinge mechanism described below, the support device 1 according to the second embodiment can improve the workability of the worker as compared to the support device 1 according to the first embodiment.

FIGS. 5A, 5B, 5C and 5D show explanatory views for each illustrating the slide hinge mechanism 13 in the support device 1 according to the second embodiment.

Figure 5A:
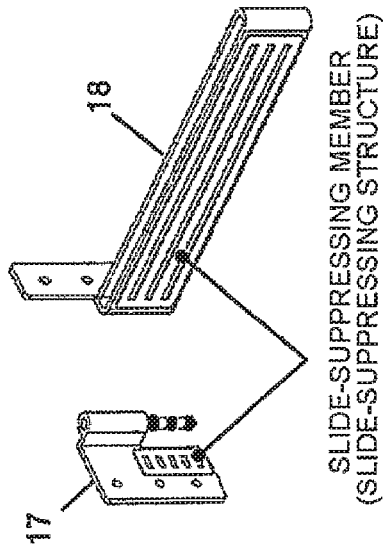
FIGS. 5A, 5B, 5C and 5D include explanatory views for illustrating a member of the slide hinge mechanism 13 in the support device 1 according to a second embodiment of this invention.

FIG. 5A is a view in which slide-suppressing members are added to the hinge piece 17. The slide-suppressing member is not particularly limited. However, a cushioning member such as rubber or sponge may be employed. In this manner, the slide hinge mechanism 13 may be constructed by adding the slide-suppressing member to the shaft and combining with the rail member 18. With this structure, strong collision between end portions of the slide rail and the shaft, or unintended sliding for the worker may be prevented.

Figure 5B:
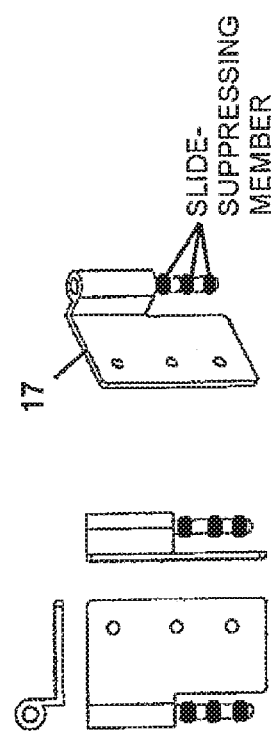

FIG. 5B is a view for illustrating a slide-suppressing structure in which the slide-suppressing member is added to at least one of the hinge piece 17 or the rail member 18. As illustrated in the figure, the slide-suppressing structure is added to one of the hinge piece 17 and the rail member 18, or both of the hinge piece 17 and the rail member 18. Accordingly, the slide hinge mechanism 13 has the structure, in which the electronic device can be slid in a state in which an angle is formed whereas the electronic device is difficult to be slid or cannot be slid in a case where an angle is not formed. As a result, the worker slides the electronic device while forming an angle obliquely. This leads to a reduction in work space, that is, slide space required on a near side of the electronic device illustrated in FIG. 1A, 1B, 1C or other figures. As a result, the space saving of the occupied area of a wall surface can further be achieved as compared to the first embodiment. Further, with this structure, strong sliding by the worker can collaterally be prevented. With the electronic device obliquely inclined, as compared to a sliding operation of an electronic device in a planar state, psychological effect that the worker carefully handles the electronic device can be obtained.

Figure 5C:
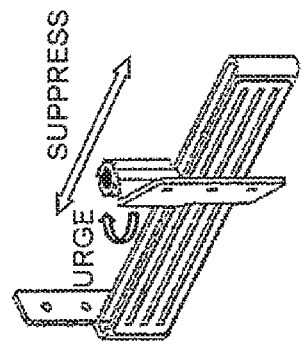

FIG. 5C is an illustration of a configuration in which a spring hinge mechanism, which is configured to pivot the electronic device in a pivoting direction, is mounted to the hinge piece 17 and the rail member 18. When a locking mechanism between the support leg 12 and the fixing leg 10 is released, the spring hinge mechanism automatically forms an angle between the support leg 12 (hinge piece 17 and housing 30) and the fixing leg 10 (mounting surface 200) by a spring urged in advance. As a result, the effect described with reference to FIG. 5B can be obtained. Urging force may be set as appropriate in accordance with a size and weight of the electronic device, a desired amount of space saving, and a desired angle of automatic pivoting.

Figure 5D:
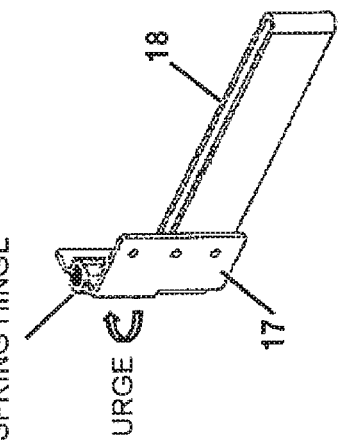

FIG. 5D is the slide hinge mechanism obtained by combining each structure illustrated in FIG. 5A to FIG. 5C. In the slide hinge mechanism, when the locking mechanism is released, an angle between the support leg 12 and the fixing leg 10 is automatically formed, and the electronic device is slidable in that state. As a result, the space saving of the work space and further improvement of the workability can be expected.

According to one embodiment of this invention, when the housing 30 of the electronic device such as the control device is installed on the mounting surface 200 such as the wall surface, the space saving of the occupied area of a wall surface on the near side can be achieved as well as the space saving of the occupied area of a wall surface on a far side illustrated in FIG. 5D. Further, the maintenance workability can be improved.

Third Embodiment

Figure 6A:
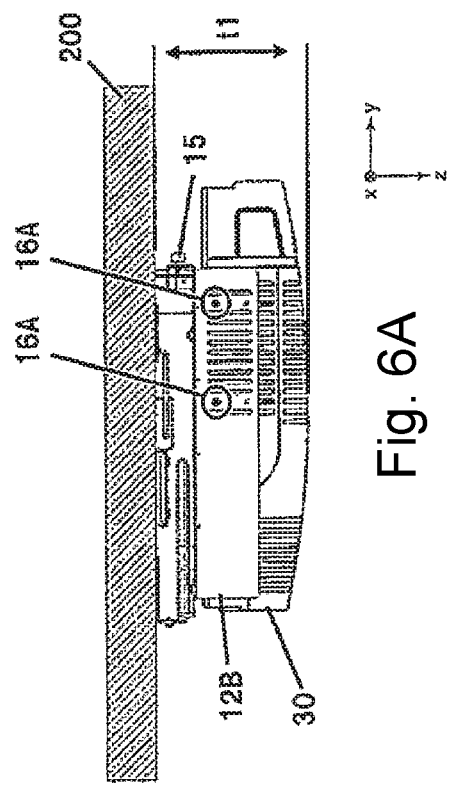
FIGS. 6A, 6B and 6C include explanatory views for illustrating space saving of the support device 1 according to a third embodiment of this invention.
Figure 6B:
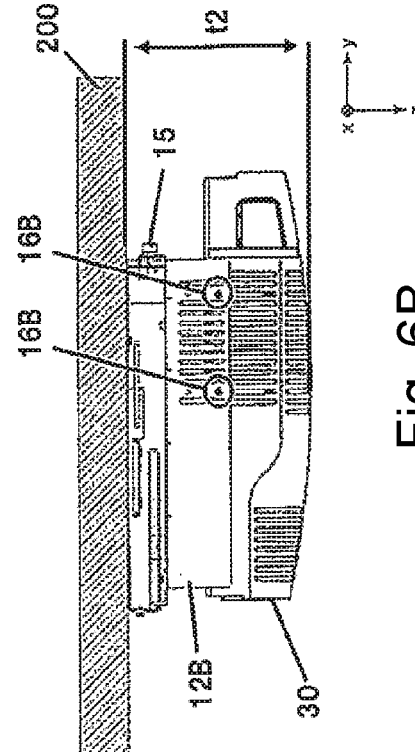
Figure 6C:
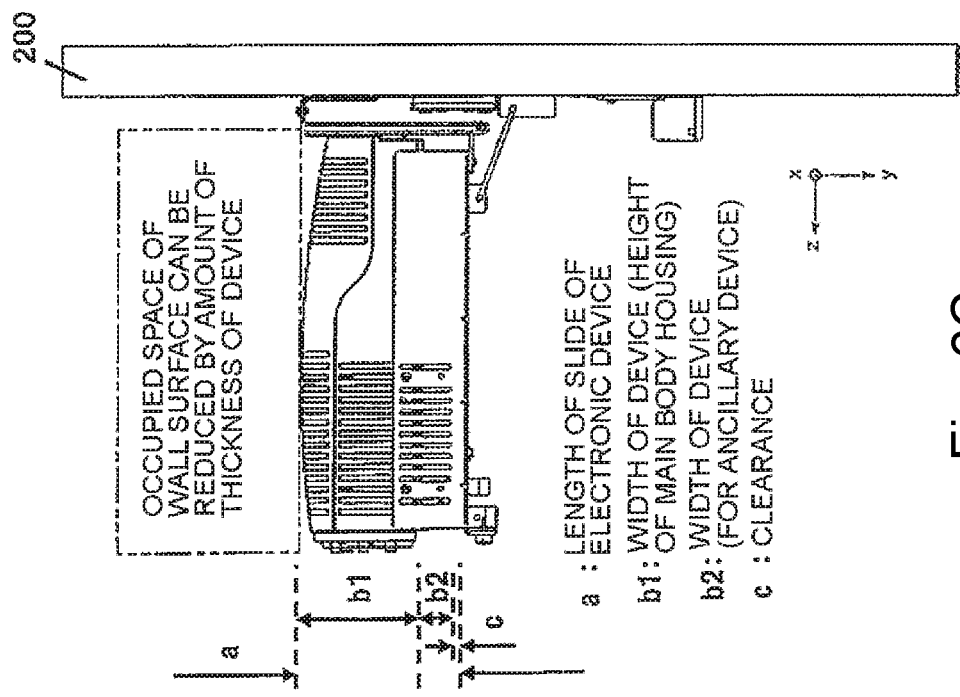

FIGS. 6A, 6B and 6C show views for each illustrating a state in which the housing 30 is mounted to the support device 1 according to this embodiment and fixed to the mounting surface 200. In this embodiment, an installation space, which is indicated by the thickness t1 and a thickness t2 from the mounting surface 200, that is, a depth in the Z-axis direction, can be adjusted based on the presence/absence of the external ancillary device such as the battery 50.

FIG. 6A is a view for illustrating a configuration when the ancillary device such as the battery 50 to be mounted to a back surface of the housing 30 is not mounted. In FIG. 6A, the housing 30 is mounted to housing mounting holes 16A formed in each of the support legs 12A and 12B with fixing means such as screws, to thereby be supported. With this configuration, the housing 30 is mounted at a position close to the mounting surface 200. Thus, the thickness t1 of the housing 30 and the support device 1 from the mounting surface 200 can be reduced, with the result that the space saving can be achieved.

Further, FIG. 6B is a view for illustrating a configuration when the ancillary device such as the battery 50 to be mounted to the back surface of the housing 30 is mounted. The housing 30 is mounted to housing mounting holes 16B formed in each of the support legs 12A and 12B with fixing means such as screws, to thereby be supported. The housing mounting holes 16B are formed at positions more distant from the mounting surface 200 than the housing mounting holes 16A. Thus, although the thickness t2 is larger than the thickness t1, a space for mounting the ancillary device can be secured between the housing 30 and the support device 1.

Further, FIG. 6C is a view for illustrating a condition which substantially specifies a length of slide of the slide hinge mechanism of this embodiment. In the slide hinge mechanism, the length of slide is determined mainly by a length of the slide rail. A slide width (a) is set to a length, which is equal to a total width of a height (b1) of the housing of the electronic device, a height (b2) of the ancillary device mounted to a bottom of the housing, and a clearance width (c). Accordingly, as described above, the space saving when the support device 1 is folded, and the optimization of the front-back space of the electronic device, specifically, the horizontal space of FIG. 6A and FIG. 6B and the vertical space of FIG. 6C required when the electronic device is shifted into a work mode can be achieved.

According to one embodiment of this invention, when the housing 30 of the electronic device such as the control device is installed on the mounting surface 200 such as the wall surface, the appropriate slide hinge mechanism, which achieves the space saving of the occupied area of a wall surface, can be obtained.

Fourth Embodiment

FIGS. 7A, 7B, 7C, 8A, 8B and 8C are explanatory views for each illustrating that the number of housings 30 to be mounted to the support device 1 described in the above-mentioned embodiments can easily be changed.

Figure 7A:
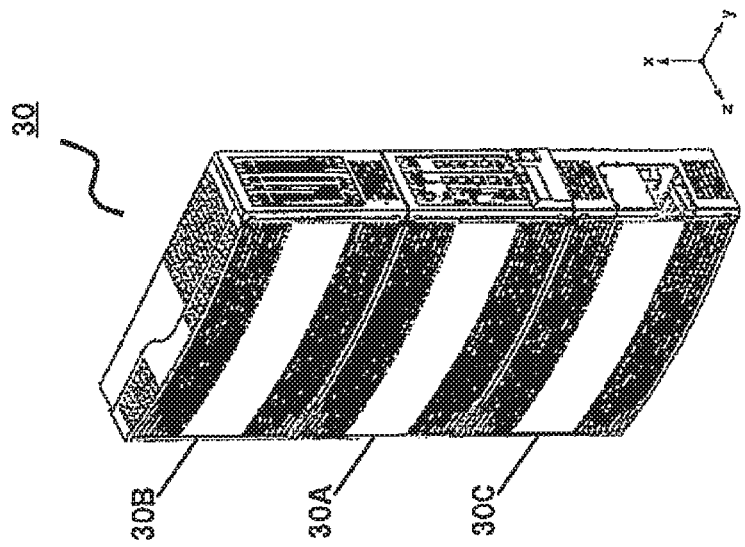
FIGS. 7A, 7B and 7C include explanatory views for illustrating an electronic device to be supported by the support device 1 according to a fourth embodiment of this invention.
Figure 7B:
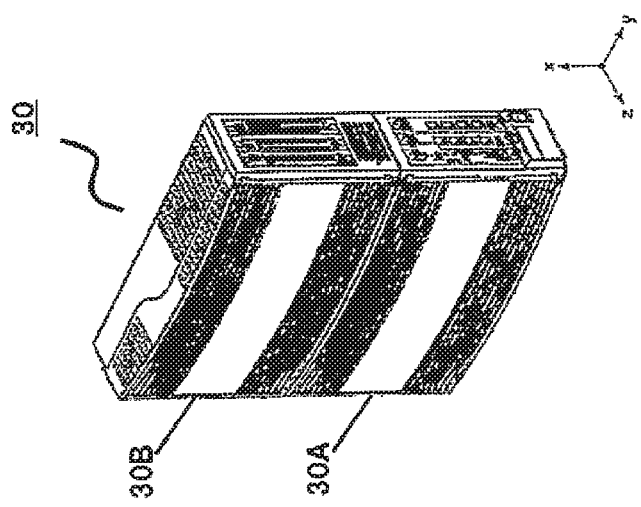
Figure 7C:
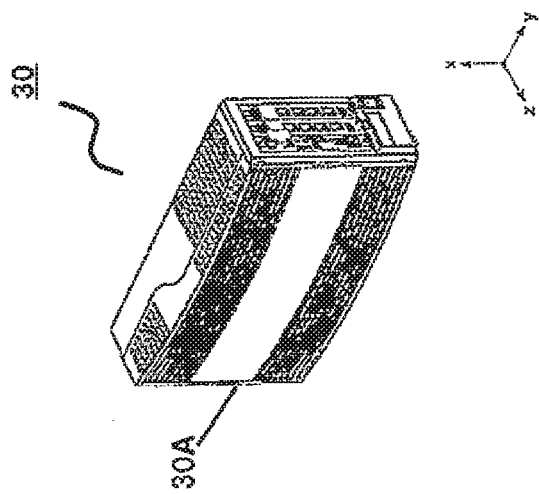
Figure 8C:
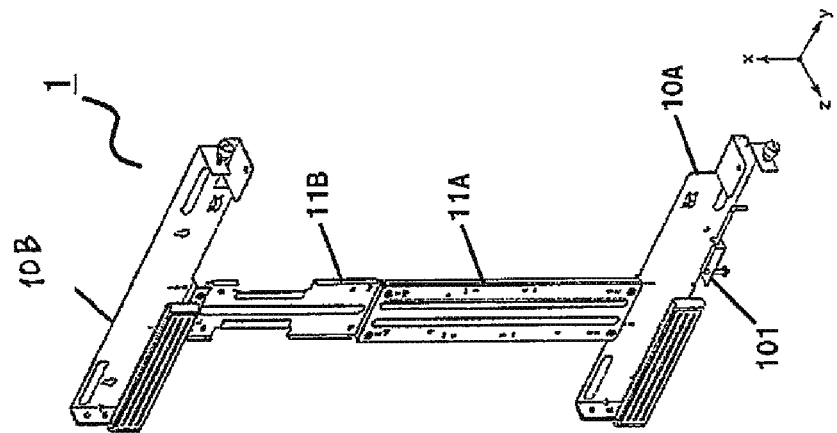
FIGS. 8A, 8B and 8C include explanatory views for illustrating the support device 1 according to the fourth embodiment.
Figure 8B:
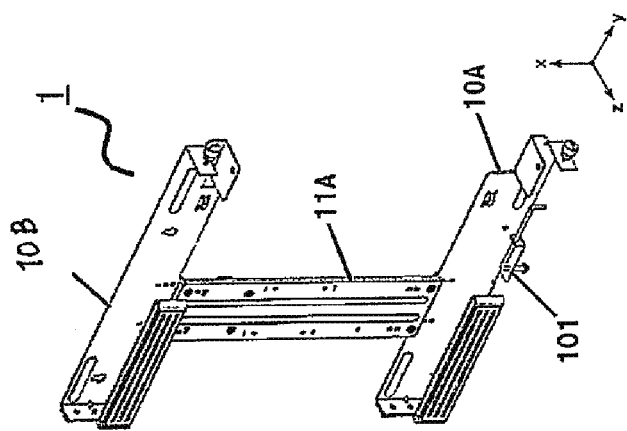
Figure 8A:
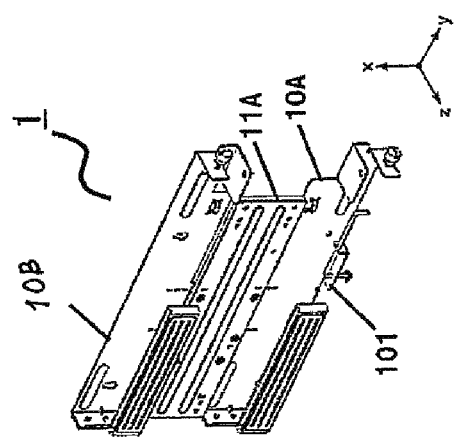
Figure 9B:
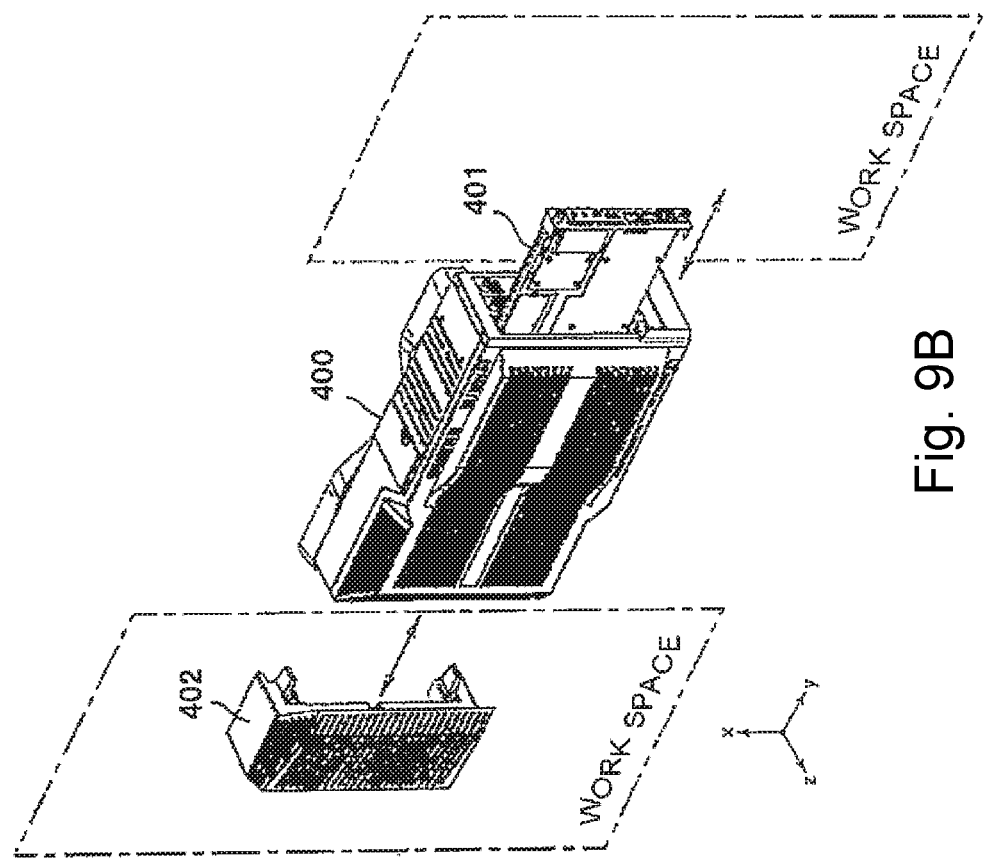
FIGS. 9A and 9B include explanatory views for illustrating an electronic device, which is supported by an associated support device configured to support the electronic device.
Figure 9A:
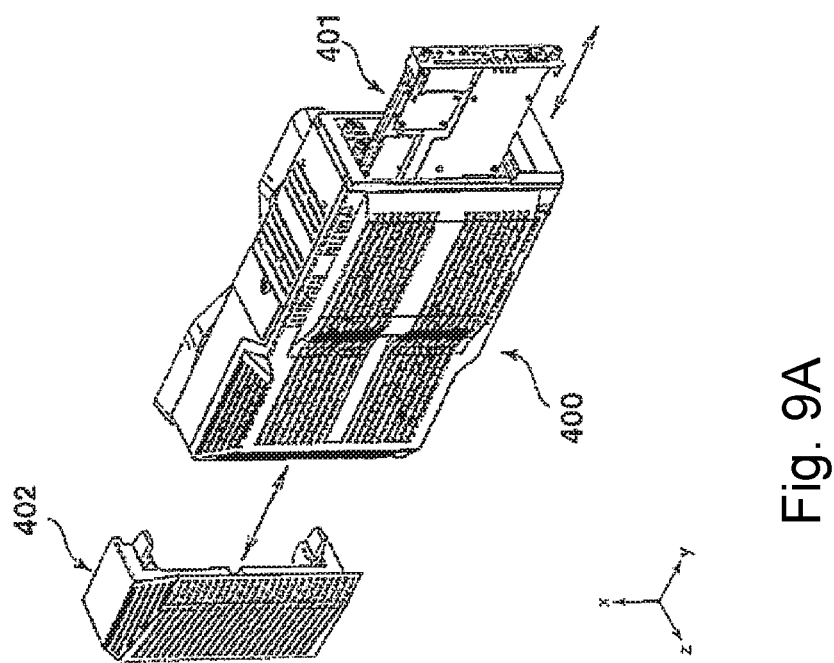

FIGS. 7A, 7B and 7C show views for each illustrating that the housing 30 to be mounted to the support device 1 can be extended as an option. The housing 30 in FIGS. 7A, 7B and 7C extends, as appropriate, an extension frame 30B and a housing frame 30C together with a basic frame 30A. The support device 1 of this embodiment is constructed such that the housings 30 can be mounted thereto. FIGS. 8A, 8B and 8C show illustrations of the height-adjustment member 11 (width-adjustment member), which is capable of easily changing the number of housings 30 to be mounted to the support device 1 of this embodiment. The height-adjustment member 11 is constructed such that the distance between the fixing legs 10 is set to a length in which the electronic device is fixed in a stepwise manner in accordance with a width of the housing of the supported electronic device. The width-adjustment member is connected to the fixing legs 10, and hence a height of the support legs 12, which are coupled to the fixing legs 10 through intermediation of the slide hinge mechanisms, can be adjusted to a width of the electronic device. The detailed description is made below.

In FIG. 8A, a first stage configuration of the support device 1 is illustrated, in which a height-changing portion 11A (height-adjustment member 11) is parallelly arranged between the pair of parallelly-arranged fixing legs 10A and 10B in the same manner so that the longitudinal direction of the height-changing portion 11A and the longitudinal direction of the pair of fixing legs 10A and 10B are connected. In order to facilitate the description, a description of the support legs 12A and 12B and the slide hinge mechanism 13 is omitted in the support device 1. The support device 1 having this first stage configuration may be installed on the mounting surface 200 while having any of the basic frame 30A, the extension frame 30B, and the housing frame 30C mounted thereon. In other words, the overall height when the height-changing portion 11A is connected to the fixing legs 10A and 10B illustrated in FIG. 8A is the same height as one basic frame 30A. The height-adjustment member 11 includes the height-changing portion 11A, which has a rectangular plate-shape, and a height-extension portion 11B. The height in the X-axis direction of the support legs 12A and 12B coupled to the pair of fixing legs 10A and 10B by the slide hinge mechanisms 13 is determined by connecting the height-changing portion 11A between the pair of fixing legs 10A and 10B and determining the height in the X-axis direction. In the first stage configuration, the height-extension portion 11B is stored on a back surface of the height-changing portion 11A.

In FIG. 8B, a second stage configuration of the support device 1 is illustrated, in which the height-changing portion 11A is perpendicularly arranged between the parallelly-arranged pair of fixing legs 10A and 10B, and an end portion in the longitudinal direction of the height-changing portion 11A is connected to an intermediate portion in the longitudinal direction of the pair of fixing legs 10A and 10B. Also in FIG. 8(b), in order to facilitate the description, a description of the support legs 12A and 12B is omitted. This support device 1 has a height that allows two housings to be mounted among the basic frame 30A, the extension frame 30B, and the housing frame 30C. With the support device 1 having the second stage configuration illustrated in FIG. 8B, the overall height of the fixing legs 10A and 10B and the height-changing portion 11A is the same height as two housings. Also in the second stage configuration, the height-extension portion 11B is stored on the back surface of the height-changing portion 11A.

In FIG. 8C, a third stage configuration of the support device 1 is illustrated, in which the height-changing portion 11A and the height-extension portion 11B are perpendicularly arranged between the parallelly-arranged pair of fixing legs 10A and 10B, and the end portions in the longitudinal direction of the height-changing portion 11A and the height-extension portion 11B are connected to the intermediate portions in the longitudinal direction of the pair of fixing legs 10A and 10B. With the support device 1 having the third stage configuration, three housings, that is, the basic frame 30A, the extension frame 30B, and the housing frame 30C, can be received by extending the height-extension portion 11B that has been stored in the height-changing portion 11A.

Also in FIG. 8C, in order to facilitate the description, a description of the support legs 12A and 12B is omitted.

Thus, according to this embodiment, the housings 30 of the electronic devices having various configurations can be wall-mounted on the mounting surface 200 with a set of support devices 1.

This invention has been described above with reference to the respective embodiments. However, this invention is not limited to the embodiments described above. The configuration and details of this invention may be changed in various ways that may be understood by the person skilled in the art within the scope of this invention. For example, in the first embodiment, the angle-adjustment shaft 14 is arranged between the fixing leg 10A and the support leg 12A. However, this invention is not limited to the configuration. As the angle fixing mechanism, the angle-adjustment shaft 14 may be arranged between the fixing leg 10B and the support leg 12B, or may be arranged between the fixing leg 10A and the support leg 12A and between the fixing leg 10B and the support leg 12B. In this case, a shaft mounting portion is formed on the fixing leg 10B, and the shaft fixing hole 121 is formed in the support leg 12B. Further, the angle fixing mechanism may be omitted. Further, in the embodiments described above, one height-adjustment member 11 is arranged between the pair of fixing legs 10A and 10B. However, as long as the pair of fixing legs 10A and 10B can be strongly fixed to the mounting surface 200 and positioned at the desired height, the height-adjustment member 11 may be omitted. Conversely, in order to reinforce the support device 1, a plurality of the height-adjustment members 11 may be arranged. Further, in the fourth embodiment, the support device 1 is described that can handle the housing 30 having at most the three stage configuration. However, this invention is not limited to this configuration. Obviously, various configurations may be employed, such as changing the configuration of the height-adjustment member 11 of the support device 1 so that the housing can handle a four stage or five stage configuration.

Further, part or whole of the above-mentioned embodiments can also be described as follows. The following supplementary notes are not intended to limit this invention.

[Supplementary Note 1]

A support device, comprising:

a pair of support legs to be mounted to a housing of an electronic device to support the housing;

a pair of fixing legs to be mounted to a mounting surface, at which the electronic device is to be installed, to fix the electronic device at a position at which the electronic device is to be installed; and a pair of slide hinge mechanisms configured to couple end portions of the pair of support legs to end portions of the pair of fixing legs in a manner in which the pair of support legs is pivotable with respect to the pair of fixing legs in an upright direction, and in a manner in which the pair of support legs is horizontally slidable with respect to the pair of fixing legs.

[Supplementary Note 2]

The support device according to the above-mentioned supplementary note, wherein the pair of slide hinge mechanisms each comprises:

a hinge piece formed of a pivot shaft and a plate portion, and fixed to the end portion of each of the pair of support legs; and a rail member formed of a slide rail and a plate portion, and fixed to the end portion of each of the pair of fixing legs.

[Supplementary Note 3]

The support device according to any one of the above-mentioned supplementary notes, wherein the pair of slide hinge mechanisms has a pivotable angle ranging from 0° to 90°.

[Supplementary Note 4]

The support device according to any one of the above-mentioned supplementary notes, wherein the pair of slide hinge mechanisms has a slide width set to a length, which is equal to a total width of a height of the housing of the electronic device, a height of an ancillary device mounted to a bottom of the housing, and a clearance width.

[Supplementary Note 5]

The support device according to any one of the above-mentioned supplementary notes, wherein the pair of slide hinge mechanisms is configured to couple the end portions of the pair of support legs to the end portions of the pair of fixing legs so as to be pivotable and slidable on a side opposite to a working surface of the electronic device, respectively.

[Supplementary Note 6]

The support device according to any one of the above-mentioned supplementary notes, wherein the each of the pair of support legs is a member formed into an L-shape, and is configured to support the housing so as to cover a corner of the housing by mounting the each of the pair of support legs to a side surface of the housing, and wherein the pair of support legs has a plurality of housing mounting holes in a direction away from the mounting surface, which are formed at positions corresponding to a total width of the height of the ancillary device mounted to the bottom of the housing and the clearance width.

[Supplementary Note 7]

The support device according to any one of the above-mentioned supplementary notes, wherein at least one of the pair of slide hinge mechanisms comprises a suppressing member configured to suppress sliding.

[Supplementary Note 8]

The support device according to any one of the above-mentioned supplementary notes, wherein at least one of the pair of slide hinge mechanisms comprises a suppressing structure configured to suppress sliding under a state in which the pair of support legs and the pair of fixing legs are prevented from forming a pivot angle.

[Supplementary Note 9]

The support device according to any one of the above-mentioned supplementary notes, wherein at least one of the pair of slide hinge mechanisms comprises a spring hinge mechanism configured to pivot the electronic device in a pivoting direction.

[Supplementary Note 10]

The support device according to any one of the above-mentioned supplementary notes, further comprising an angle-adjustment member configured to fix an angle formed between the housing pivoted by the pair of slide hinge mechanisms and the mounting surface, wherein one of or both of the pair of support legs have a fixing groove or a fixing hole for fixing the housing at a specific angle.

[Supplementary Note 11]

The support device according to any one of the above-mentioned supplementary notes, further comprising a width-adjustment member to be connected to the pair of fixing legs to fix a distance between the pair of fixing legs in a stepwise manner in accordance with a width of the housing of the supported electronic device, wherein a height of the pair of support legs, which is coupled to the pair of fixing legs through intermediation of the pair of slide hinge mechanisms, is adjusted to a height of the housing of the electronic device by connecting the width-adjustment member to the pair of fixing legs.

[Supplementary Note 12]

The support device according to any one of the above-mentioned supplementary notes, in which the suppressing member, which is arranged on at least one of the pair of slide hinge mechanisms, is arranged on a pivot-sliding shaft.

[Supplementary Note 13]

The support device according to any one of the above-mentioned supplementary note, in which the suppressing member, which is arranged on at least one of the slide hinge mechanisms, is arranged on a nipping surface of at least one of the slide rail or the hinge piece.

[Supplementary Note 14]

A support method using a support device of an electronic device, comprising:

coupling end portions of a pair of support legs, which is to be mounted to a housing of the electronic device to support the housing, and end portions of a pair of fixing legs, which is to be mounted to a mounting surface at which the electronic device is to be installed to fix the electronic device at a position at which the electronic device is to be installed, through intermediation of a pair of slide hinge mechanisms, which is configured to couple the end portions of the pair of support legs to the end portions of the pair of fixing legs in a manner in which the pair of support legs is pivotable with respect to the pair of fixing legs in an upright direction, and in a manner in which the pair of support legs is horizontally slidable with respect to the pair of fixing legs; and horizontally sliding the electronic device with respect to the pair of fixing legs and pivoting the electronic device with respect to the pair of fixing legs in the upright direction when the electronic device is shifted from a received state to a pivoted state.

[Supplementary Note 15]

The support method using the support device of the electronic device according to the above-mentioned supplementary note, in which at least one of the pair of slide hinge mechanisms has a suppressing member on a pivot-sliding shaft thereof, and in which, when the electronic device is shifted from the received state to the pivoted state, the horizontally sliding the electronic device with respect to the pair of fixing legs is carried out while suppressing the sliding by the suppressing member, and then the pivoting the electronic device with respect to the pair of fixing legs in the upright direction is carried out.

[Supplementary Note 16]

The support method using the support device of the electronic device according to the above-mentioned supplementary note, in which at least one of the pair of slide hinge mechanisms has the suppressing member on at least one of nipping surfaces of the slide rail and the hinge piece, and in which, when the electronic device is shifted from the received state to the pivoted state, the horizontally sliding the electronic device with respect to the pair of fixing legs is carried out while forming a pivot angle between the pair of support legs and the pair of fixing legs after the suppressing by the suppressing member is released, and then the pivoting the electronic device with respect to the pair of fixing legs in the upright direction is carried out.

[Supplementary Note 17]

The support method using the support device of the electronic device according to the above-mentioned supplementary note, in which at least one of the pair of slide hinge mechanisms includes a spring hinge mechanism configured to urge the slide rail and the hinge piece so that an angle is formed therebetween, and a locking mechanism configured to fix the spring hinge mechanism in a folded state, and in which, when the electronic device is shifted from the received state to the pivoted state, the horizontally sliding the electronic device with respect to the pair of fixing legs is carried out while releasing the locking mechanism and forming the pivot angle between the pair of support legs and the pair of fixing legs, and then the pivoting the electronic device with respect to the pair of fixing legs in the upright direction is carried out.

The support device and the support method according to this invention may be applied to a product capable of being wall-mounted, as well as a peripheral device used together with the electronic device and other devices.

REFERENCE SIGNS LIST 1 support device
10A, 10B fixing leg
101 shaft mounting portion
11 height-adjustment member
11A height-changing portion
11B height-extension portion
12A, 12B support leg
121 shaft fixing hole (for fixing at 90°)
13 (13A, 13B) slide hinge mechanism
14 angle-adjustment shaft
15 male screw (knurled screw)
16 (16A, 16B) housing mounting hole
17 (17A, 17B) hinge piece
18 (18A, 18B) rail member
30 housing (electronic device)
30A basic frame
30B extension frame
30C housing frame
40 option card
50 battery
200 mounting surface

The invention claimed is:

1. A support device, comprising:
a pair of support legs configured to be mounted to a housing of an electronic device to support the housing;
a pair of fixing legs configured to be mounted to a mounting surface, at which the electronic device is to be installed, to fix the electronic device at a position at which the electronic device is to be installed; and
a pair of slide hinge mechanisms configured to couple end portions of the pair of support legs to end portions of the pair of fixing legs in a manner in which the pair of support legs is pivotable with respect to the pair of fixing legs in an upright direction, and in a manner in which the pair of support legs is horizontally slidable with respect to the pair of fixing legs,
wherein at least one of the pair of slide hinge mechanisms comprises a suppressing structure configured to suppress sliding under a state in which the pair of support legs and the pair of fixing legs are prevented from forming a pivot angle.

2. The support device according to claim 1, wherein the pair of slide hinge mechanisms each comprises:

a hinge piece formed of a pivot shaft and a plate portion, and fixed to the end portion of each of the pair of support legs; and a rail member formed of a slide rail and a plate portion, and fixed to the end portion of each of the pair of fixing legs.

3. The support device according to claim 1, wherein the pair of slide hinge mechanisms has a pivotable angle ranging from 0° to 90°.

4. The support device according to claim 1, wherein the pair of slide hinge mechanisms has a slide width set to a length, which is equal to a total width of a height of the housing of the electronic device, a height of an ancillary device mounted to a bottom of the housing, and a clearance width.

5. The support device according to claim 1, wherein the pair of slide hinge mechanisms is configured to couple the end portions of the pair of support legs to the end portions of the pair of fixing legs so as to be pivotable and slidable on a side opposite to a working surface of the electronic device, respectively.

6. The support device according to claim 1,
wherein the each of the pair of support legs is a member formed into an L-shape, and is configured to support the housing so as to cover a corner of the housing by mounting the each of the pair of support legs to a side surface of the housing, and
wherein the pair of support legs has a plurality of housing mounting holes in a direction away from the mounting surface, which are formed at positions corresponding to a total width of the height of the ancillary device mounted to the bottom of the housing and the clearance width.

7. The support device according to claim 1, wherein at least one of the pair of slide hinge mechanisms comprises a suppressing member configured to suppress sliding.

8. The support device according to claim 1, wherein at least one of the pair of slide hinge mechanisms comprises a spring hinge mechanism configured to pivot the electronic device in a pivoting direction.

9. The support device according to claim 1, further comprising an angle-adjustment member configured to fix an angle formed between the housing pivoted by the pair of slide hinge mechanisms and the mounting surface,
wherein one of or both of the pair of support legs have a fixing groove or a fixing hole for fixing the housing at a specific angle.

10. The support device according to claim 1, further comprising a width-adjustment member configured to be connected to the pair of fixing legs to fix a distance between the pair of fixing legs in a stepwise manner in accordance with a width of the housing of the supported electronic device,
wherein a height of the pair of support legs, which is coupled to the pair of fixing legs through intermediation of the pair of slide hinge mechanisms, is configured to be adjusted to a height of the housing of the electronic device by connecting the width-adjustment member to the pair of fixing legs.

11. A support method using a support device of an electronic device, comprising:
coupling end portions of a pair of support legs, which is to be mounted to a housing of the electronic device to support the housing, and end portions of a pair of fixing legs, which are configured to be mounted to a mounting surface at which the electronic device is to be installed to fix the electronic device at a position at which the electronic device is to be installed, through intermediation of a pair of slide hinge mechanisms, which is configured to couple the end portions of the pair of support legs to the end portions of the pair of fixing legs in a manner in which the pair of support legs is pivotable with respect to the pair of fixing legs in an upright direction, and in a manner in which the pair of support legs is horizontally slidable with respect to the pair of fixing legs, and suppress sliding under a state in which the pair of support legs and the pair of fixing legs are prevented from forming a pivot angle; and
horizontally sliding the electronic device with respect to the pair of fixing legs and pivoting the electronic device with respect to the pair of fixing legs in the upright direction when the electronic device is shifted from a received state to a pivoted state.

* * * * *

UNITED STATES PATENT AND TRADEMARK OFFICE
CERTIFICATE OF CORRECTION

PATENT NO. : 10,206,305 B2
APPLICATION NO. : 15/519261
DATED : February 12, 2019
INVENTOR(S) : Chiaki Terao It is certified that error appears in the above-identified patent and that said Letters Patent is hereby corrected as shown below:

Page 2, Column 2, Foreign Patent Documents, Line 1; Delete "64-006064" and insert --64-006084-- therefor Signed and Sealed this
Thirtieth Day of July, 2019

Andrei Iancu
*Director of the United States Patent and Trademark Office*